(12) United States Patent
Wotring

(10) Patent No.: US 6,199,624 B1
(45) Date of Patent: Mar. 13, 2001

(54) FOLDED FIN HEAT SINK AND A HEAT EXCHANGER EMPLOYING THE HEAT SINK

(75) Inventor: Blaine C. Wotring, Derry, NH (US)

(73) Assignee: Molex Incorporated, Lisle, IL (US)

( * ) Notice: Subject to any disclaimer, the term of this patent is extended or adjusted under 35 U.S.C. 154(b) by 0 days.

(21) Appl. No.: 09/303,806

(22) Filed: Apr. 30, 1999

(51) Int. Cl.[7] .................................................. H05K 7/20
(52) U.S. Cl. ........................ 165/80.3; 165/121; 361/697
(58) Field of Search ................... 165/80.3, 121; 361/697, 704

(56) References Cited

U.S. PATENT DOCUMENTS

| | | | |
|---|---|---|---|
| 5,132,780 | * 7/1992 | Higgins, III | 165/80.3 |
| 5,523,918 | * 6/1996 | Chiou | 361/695 |
| 5,582,240 | * 12/1996 | Widmayer | 165/80.3 |
| 5,661,638 | * 8/1997 | Mira | 361/697 |
| 5,706,169 | * 1/1998 | Yeh | 361/690 |
| 5,979,541 | * 11/1999 | Saito | 165/80.3 |
| 6,021,844 | * 6/1998 | Batchelder | 165/80.3 |
| 6,026,895 | * 2/1998 | Moresco et al. | 165/185 |

* cited by examiner

*Primary Examiner*—Allen Flanigan
(74) *Attorney, Agent, or Firm*—Robert J. Zeitler

(57) ABSTRACT

A heat sink is disclosed for use with a heat exchanger employing a circular fan which forces air in a volute path about a central axis. The heat sink includes a plurality of heat exchanging sections disposed in the path about the axis. Each heat exchanging section includes a thermally conductive sheet folded into alternating ridges and troughs defining generally parallel spaced fins. The heat exchanging sections are oriented such that the fins of each section are at an angle to the fins of an adjacent section.

22 Claims, 5 Drawing Sheets

FOLDED FIN HEAT SINK AND A HEAT EXCHANGER EMPLOYING THE HEAT SINK

FIELD OF THE INVENTION

This invention generally relates to cooling devices such as heat exchangers and, particularly, to a heat sink particularly adapted for cooling such components as integrated circuit chips, as in cooling central processing units (CPUs).

BACKGROUND OF THE INVENTION

In various industries, such as in the computer industry, there is a need for low cost high performance heat exchangers to cool such components as microprocessors or semiconductors. Many semiconductors create so much heat that they can be irreparably damaged if the heat is not removed. Consequently, heat exchangers employing heat sinks have been used to pull the heat away from the semiconductor and disperse that heat into the atmosphere.

One type of heat sink used with semiconductors is a simple aluminum extrusion screwed down or clamped to the semiconductor. The extrusion typically has a flat bottom plate which contacts the semiconductor and a plurality of fins or parallel protrusions extending from the plate in a comb-type configuration. Such extrusions have many limitations, including the height of the fins being limited by the thicknesses of the fins. The number of fins per square inch is limited by the thickness and the height. Such limitations on the density of the fins on such extrusions reduces the efficiency of the heat removal.

A significantly improved heat sink has been designed particularly for use with fanned heat exchangers. This heat sink employs a "folded fin" configuration wherein the folded fin is clamped or bonded to a thermally conductive plate to form a heat sink assembly. In particular, a folded fin heat sink is formed by a sheet of aluminum or other heat conductive material which is folded into a wave-like pattern forming an alternating series of ridges and troughs (grooves). The folded fin may be placed directly on a substrate to be cooled or on a separate conductive base plate to form the heat sink assembly. This folded fin design offers high thermal conductivity, extremely large surface area and low costs. By taking advantage of the large surface area, less air flow is required to meet industry standard thermal specifications.

The present invention is directed to an improved folded fin-type heat exchanger which reduces air back pressure and improves the efficiency of the heat sink. The invention is particularly applicable for use with fanned heat exchangers, and the improved heat sink is capable of reducing the fan RPM and, thereby, reduce the fan noise.

SUMMARY OF THE INVENTION

An object, therefore, of the invention is to provide a new and improved heat sink for use with a heat exchanger, such as a heat exchanger employing a circular fan which forces air in a volute path about a central axis.

Another object of the invention is to provide a heat exchanger assembly which includes the heat sink in combination with a circular fan.

In the exemplary embodiment of the invention, the heat sink includes a plurality of heat exchanging sections disposed in the volute path of the circular fan about the axis thereof. Each heat exchanging section includes a thermally conductive sheet folded into alternating ridges and troughs defining generally parallel spaced fins. The heat exchanging sections are oriented such that the fins of each section are at an angle to the fins of an adjacent section.

Generally, at least one of the fins of each heat exchanging section radiates outwardly from a point near the axis of the volute air path. The heat exchanging sections are generally rectangular. As disclosed herein, the heat exchanging sections are generally square, and four of the sections divide the path of air into quadrants. The fins of each heat exchanging section are generally perpendicular to the fins of an adjacent section.

Finally, the ridges of each heat exchanging section have opposite ends, and cutout portions are formed in the ridges spaced from and intermediate the opposite ends thereof. These cutout portions improve air flow through the fins. Specifically, the air flows through the cutout portions across both sides of the fins.

Other objects, features and advantages of the invention will be apparent from the following detailed description taken in connection with the accompanying drawings.

BRIEF DESCRIPTION OF THE DRAWINGS

The features of this invention which are believed to be novel are set forth with particularity in the appended claims. The invention, together with its objects and the advantages thereof, may be best understood by reference to the following description taken in conjunction with the accompanying drawings, in which like reference numerals identify like elements in the figures and in which:

DETAILED DESCRIPTION OF THE PREFERRED EMBODIMENT

Figure 1:
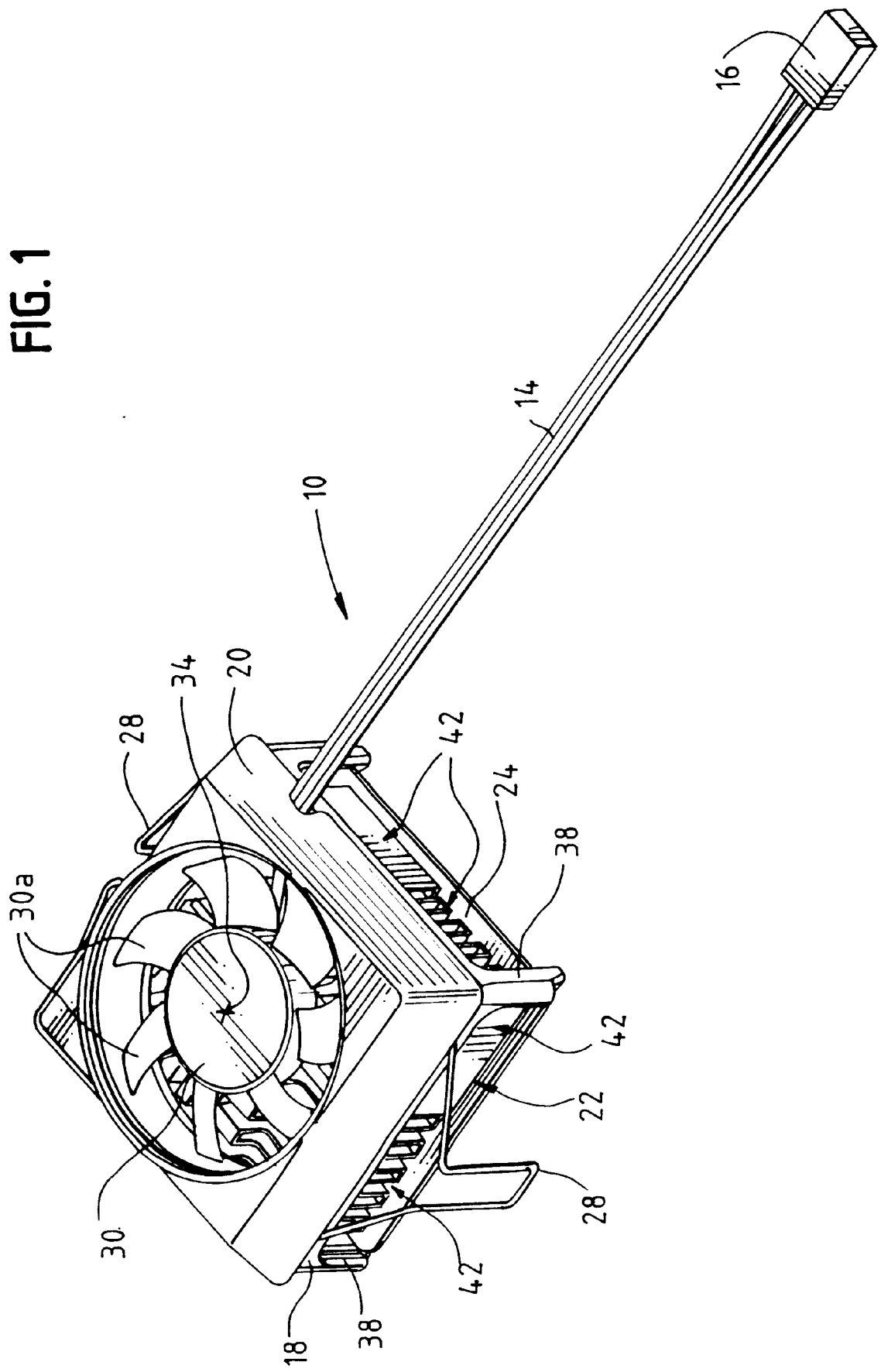
FIG. 1 is a top perspective view of a heat exchanger assembly incorporating the heat sink assembly of the invention.
Figure 2:
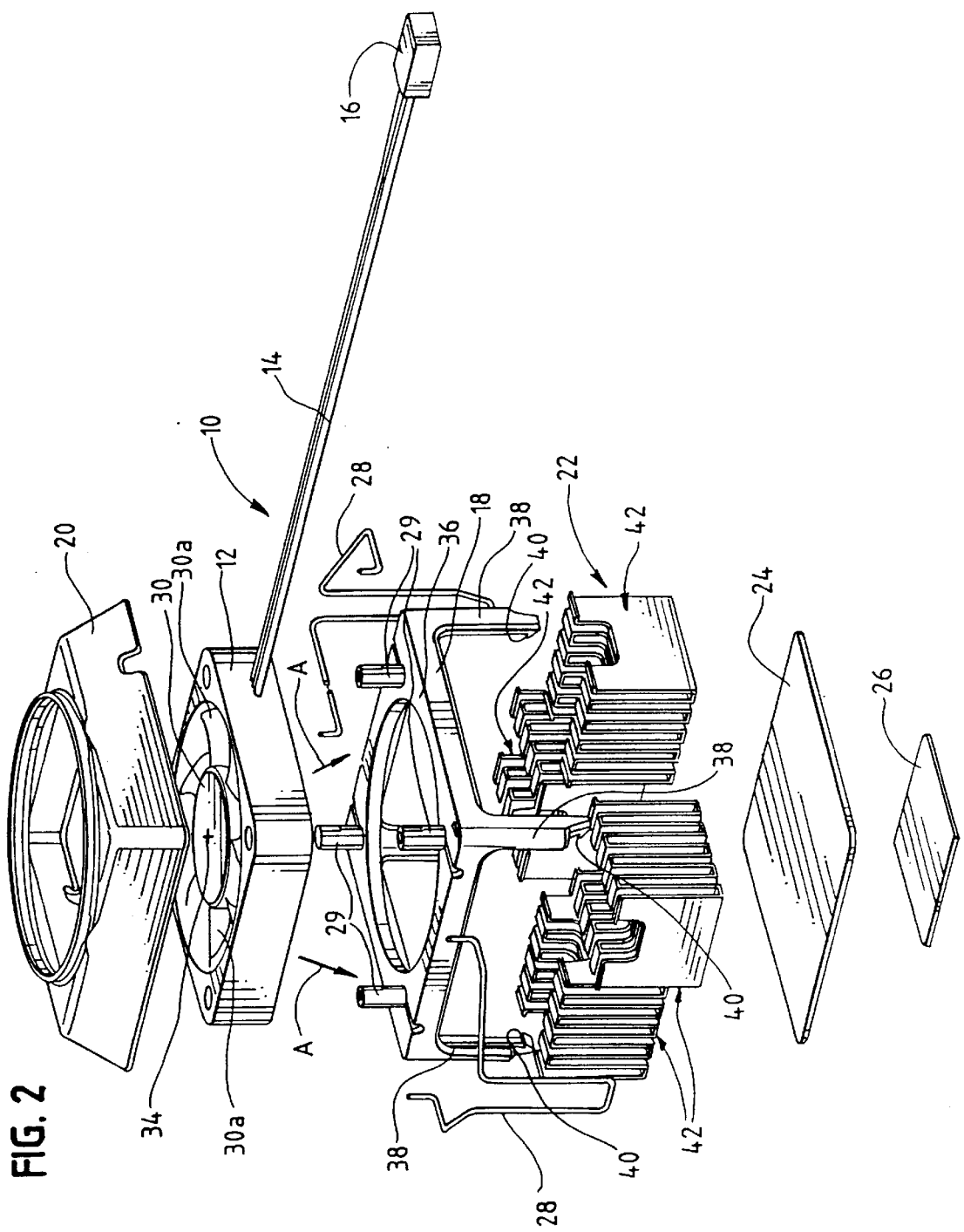
FIG. 2 is an exploded perspective view of the heat exchanger assembly of FIG. 1.

Referring to the drawings in greater detail, and first to FIGS. 1 and 2, the invention is incorporated in a heat exchanger assembly, generally designated 10, which includes a circular fan 12 having lead wires 14 extending therefrom and terminating in an electrical connector 16. The fan is mounted on top of a housing base 18, and a cover or cap 20 is positioned over the fan. A heat sink assembly, generally designated 22, is mounted within housing base 18. The heat sink assembly is pressed against a conductive base plate 24 which has a thermal interface 26 on the bottom thereof. Alternatively, the heat sink assembly 22 can be bonded to a conductive base plate 24 with thermally conductive epoxy. Finally, a pair of springs 28 are used to mount the heat exchanger assembly on top of an integrated circuit chip such as a chip of a central processing unit (not shown).

More particularly, circular fan 12 is mounted on top of housing base 18 by means of four mounting posts 29 projecting upwardly from the base. Circular fan 12 includes a circular fan blade assembly 30 having radially extending fan blades 30a which are rotated about a central axis 34 to force air in a volute path downwardly in the general direction of arrows "A" (FIG. 2). Cap 20 is snap-fit onto the top of the housing of circular fan 12.

Heat sink assembly 22 is sandwiched between a top wall 36 of housing base 18 and conductive base plate 24. Specifically, housing base 18 is generally square and includes four depending legs 38 having ramped hooks 40 near the distal ends thereof. The corners of conductive base plate 24 are snapped into engagement behind ramped hooks 40 of legs 38 to clamp heat sink assembly 22 between the conductive base plate and top wall 36 of housing base 18.

Referring to FIGS. 3–6 in conjunction with FIGS. 1 and 2, heat sink assembly 22 includes a plurality of heat exchanging sections, generally designated 42. Each heat exchanging section is formed by a thermally conductive sheet folded into alternating ridges 44 and troughs 46 to define generally parallel spaced fins 48. Generally, heat exchanging sections 42 of heat sink assembly 22 are oriented such that fins 48 of each section are at an angle to the fins of an adjacent section. The folded sheet may be of aluminum or copper material.

Still more specifically, heat exchanging sections 42 are generally rectangular in configuration. In the preferred embodiment, it can be seen that the heat exchanging sections are generally square in configuration and, in a three-dimensional context, each heat exchanging section 42 is generally in the form of a cube. Four such square or cubed heat exchanging sections are assembled on or bonded to conductive base plate 24 such that the fins 48 of each section are generally perpendicular to the fins of any adjacent section. All four sections meet at a central point 50 which is coincident with axis 34 (FIG. 2) of circular fan 12. The outermost ridges are longitudinally cut generally along their center-lines to define top flanges 52 which abut the ends of the ridges of the adjacent heat exchanging sections. Finally, it can be seen that troughs 46 are flattened to provide flat surfaces pressed against the flat conductive base plate 24.

In essence, the four square heat exchanging sections 42 of heat sink assembly 22 divide the volute air path from circular fan 12 into quadrants. The fins of the heat exchanging sections in each quadrant extend generally perpendicular to the fins of any adjacent quadrant and, thereby, form radiating flow paths about central axis 34. Although the fins of the heat exchanging sections are not precisely on radii about central axis 34, each quadrant defined by each heat exchanging section includes a cluster of linear fins at different angles about the central axis to maximize air flow from the rotating fan blades of circular fan 12. This configuration of a plurality of heat exchanging sections results in increased air flow over an array of parallel fins across the entire air flow path. The use of clusters of radiating fins can result in either a reduction of the fan speed and resulting noise or an increase the air flow at any given speed.

Figure 3:
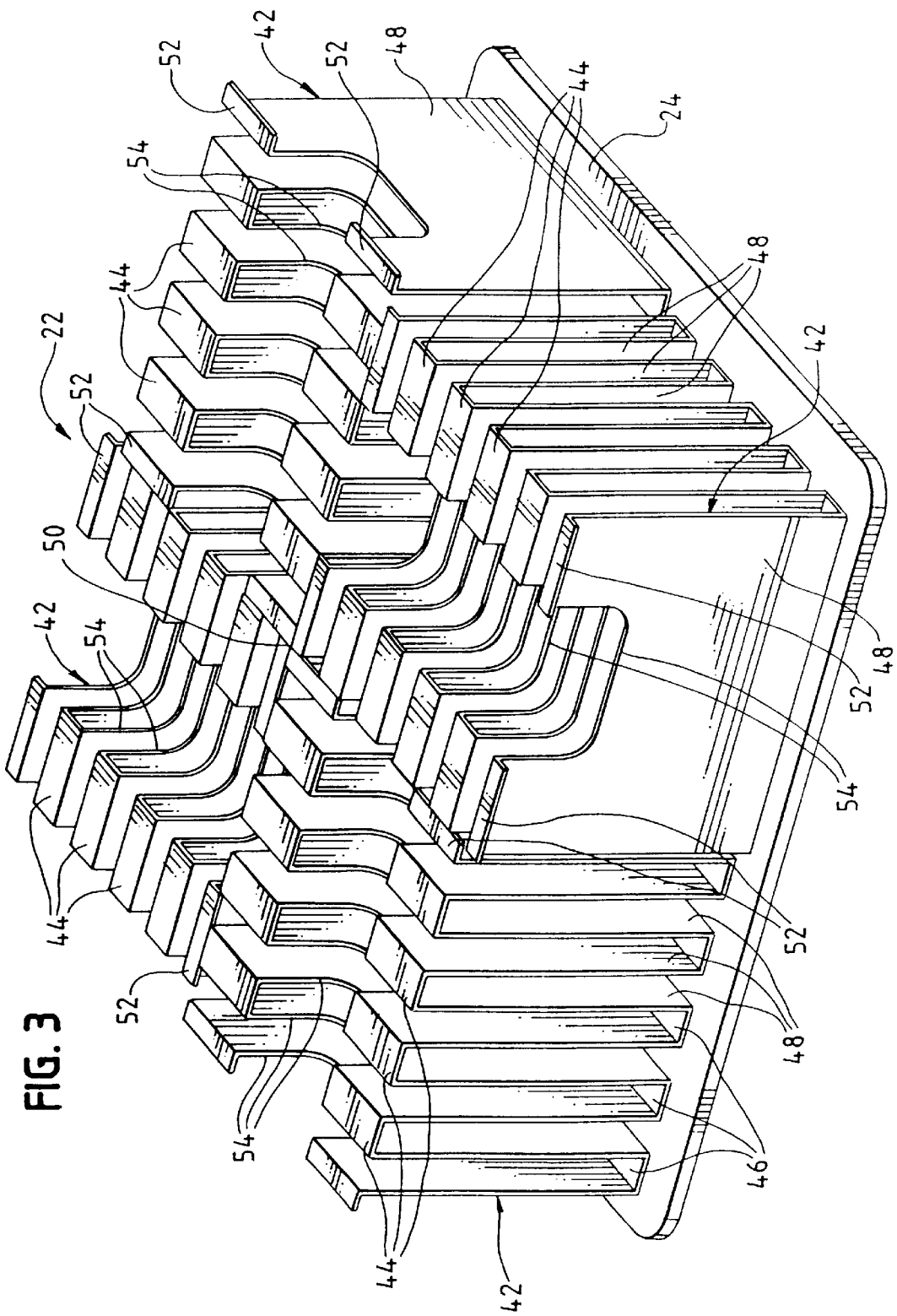
FIG. 3 is a top perspective view of the heat sink assembly removed from the heat exchanger.
Figure 4:
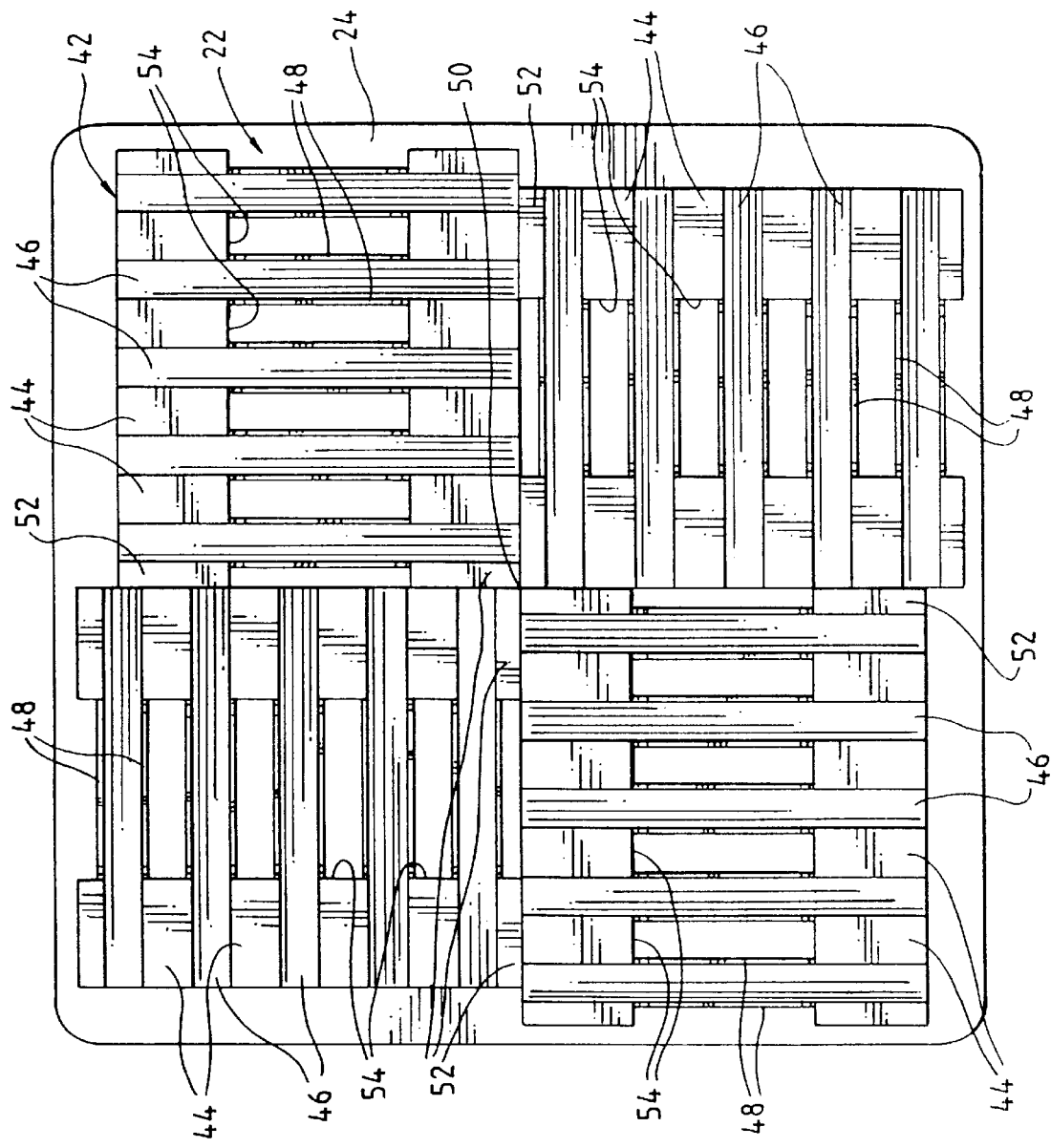
FIG. 4 is a top plan view of the heat sink assembly.
Figure 5:
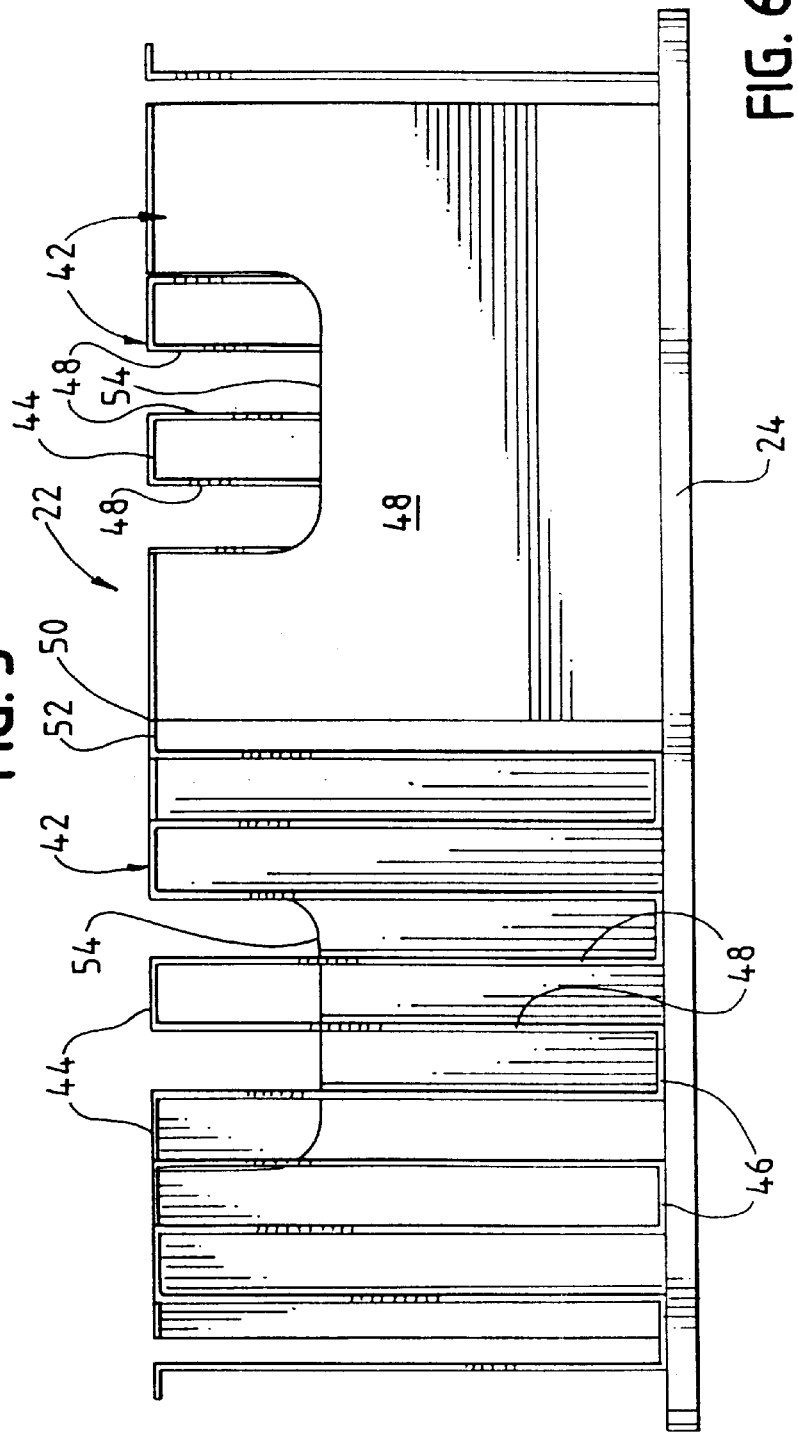
FIG. 5 is a side elevational view of the heat sink assembly.
Figure 6:
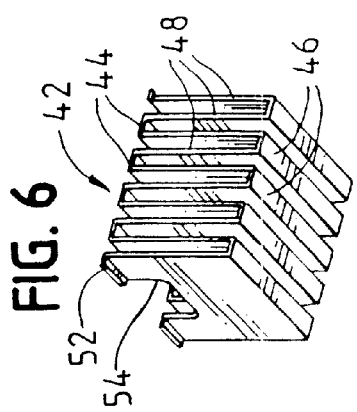
FIG. 6 is a bottom perspective view of one of the heat exchanging sections of the heat sink assembly.

Finally, FIG. 3 best shows that each ridge 44 of each heat exchanging section 42 includes a cutout portion 54 intermediate opposite ends of each ridge. These cutout portions provide improved air flow through or across fins 48. In other words, the cutout portions allow the air to flow along the insides of the ridges and over both sides of all of the fins 48.

It will be understood that the invention may be embodied in other specific forms without departing from the spirit or central characteristics thereof. The present examples and embodiments, therefore, are to be considered in all respects as illustrative and not restrictive, and the invention is not to be limited to the details given herein.

What is claimed is:

1. A heat sink for use with a heat exchanger employing a circular fan which forces air in a volute path about a central axis, comprising:

a plurality of heat exchanging sections disposed in said path about said axis, each heat exchanging section including a thermally conductive sheet folded into alternating ridges and troughs defining generally parallel spaced fins, and said heat exchanging sections being oriented such that the fins of each section are at an angle to the fins of an adjacent section.

2. The heat sink of claim 1 wherein at least one of the fins of each heat exchanging section radiates outwardly from a point near said axis.

3. The heat sink of claim 1 wherein said heat exchanging sections are generally rectangular.

4. The heat sink of claim 3 wherein said heat exchanging sections are generally square.

5. The heat sink of claim 1 wherein the fins of each heat exchanging section are generally perpendicular to the fins of an adjacent section.

6. The heat sink of claim 1, including four of said heat exchanging sections dividing the path of said air into quadrants.

7. The heat sink of claim 1 wherein said ridges have opposite ends, and including cutout portions of the ridges spaced from and intermediate the opposite ends.

8. A heat sink for use with a heat exchanger employing a circular fan which forces air in a volute path about a central axis, comprising:

a plurality of generally rectangular heat exchanging sections disposed in said path about said axis, each heat exchanging section including a thermally conductive sheet folded into alternating ridges and troughs defining generally parallel spaced fins, and said heat exchanging sections being oriented such that the fins of each section are generally perpendicular to the fins of an adjacent section.

9. The heat sink of claim 8 wherein said heat exchanging sections are generally square.

10. The heat sink of claim 9 wherein at least one of the fins of each heat exchanging section radiates outwardly from a point near said axis.

11. The heat sink of claim 8, including four of said heat exchanging sections dividing the path of said air into quadrants.

12. The heat sink of claim 8 wherein said ridges have opposite ends, and including cutout portions of the ridges spaced from and intermediate the opposite ends.

13. A heat exchanger assembly, comprising:

a housing;

a circular fan mounted on the housing for forcing air in a volute path about a central axis; and a heat sink assembly including a plurality of heat exchanging sections disposed in said path about said axis, each heat exchanging section including a thermally conductive sheet folded into alternating ridges and troughs defining generally parallel spaced fins, and said heat exchanging sections being oriented such that the fins of each section are at an angle to the fins of an adjacent section.

14. The heat exchanger assembly of claim 13 wherein said heat exchanging sections are mounted on top of a conductive base plate.

15. The heat exchanger assembly of claim 14, including clamp means operatively associated between the housing and the base plate to clamp the heat exchanging sections therebetween.

16. The heat exchanger of claim 14 wherein at least one of the fins of each heat exchanging section radiates outwardly from a point near said axis.

17. The heat exchanger of claim 14 wherein said heat exchanging sections are generally rectangular.

18. The heat exchanger of claim 17 wherein said heat exchanging sections are generally square.

19. The heat exchanger of claim 14 wherein the fins of each heat exchanging section are generally perpendicular to the fins of an adjacent section.

20. The heat exchanger of claim 14, including four of said heat exchanging sections dividing the path of said air into quadrants.

21. The heat exchanger of claim 15 wherein said ridges have opposite ends, and including cutout portions of the ridges spaced from and intermediate the opposite ends.

22. The heat exchanger of claim 14 wherein said heat sink assembly is mounted to said conductive base plate with thermally conductive epoxy.

\* \* \* \* \*